United States Patent
Fuin

(10) Patent No.: US 7,616,137 B2
(45) Date of Patent: *Nov. 10, 2009

(54) METHOD AND APPARATUS FOR COMPRESSION AND DECOMPRESSION OF AN EXECUTABLE CODE WITH A RISC PROCESSOR

(75) Inventor: Didier Fuin, Lumbin (FR)

(73) Assignee: STMicroelectronics, SA, Montrouge (FR)

( * ) Notice: Subject to any disclaimer, the term of this patent is extended or adjusted under 35 U.S.C. 154(b) by 498 days.

This patent is subject to a terminal disclaimer.

(21) Appl. No.: 11/480,769

(22) Filed: Jun. 30, 2006

(65) Prior Publication Data

US 2008/0256332 A1 Oct. 16, 2008

(30) Foreign Application Priority Data

Jul. 1, 2005 (FR) .................................. 05 07028
Jul. 1, 2005 (FR) .................................. 05 07029

(51) Int. Cl.
*H03M 7/00* (2006.01)
(52) U.S. Cl. ........................... 341/106; 341/65; 341/67; 341/105; 341/107
(58) Field of Classification Search .................... 341/65, 341/67, 106, 107, 105
See application file for complete search history.

(56) References Cited

U.S. PATENT DOCUMENTS

| | | | |
|---|---|---|---|
| 5,337,087 A * | 8/1994 | Mishima | 375/240.04 |
| 5,363,097 A * | 11/1994 | Jan | 341/67 |
| 5,764,994 A | 6/1998 | Craft | |
| 5,819,058 A | 10/1998 | Miller et al. | |
| 6,199,126 B1 | 3/2001 | Auerbach et al. | |
| 6,618,506 B1 | 9/2003 | Auerbach et al. | |
| 6,977,941 B2 * | 12/2005 | Takahashi et al. | 370/412 |
| 7,522,775 B2 * | 4/2009 | Boon | 382/233 |
| 2002/0089436 A1 | 7/2002 | Yariv | |
| 2002/0199083 A1 | 12/2002 | Kao et al. | |
| 2003/0044074 A1 * | 3/2003 | Weiss et al. | 382/233 |
| 2003/0118114 A1 * | 6/2003 | Penna | 375/240.25 |
| 2004/0021593 A1 * | 2/2004 | Park et al. | 341/67 |
| 2005/0196151 A1 * | 9/2005 | Takagi et al. | 386/124 |
| 2007/0194957 A1 * | 8/2007 | Watanabe | 341/106 |

(Continued)

OTHER PUBLICATIONS

11/480781.DidierFuin,"Process and Devices for Compression and Decompression of Execuatable Code by a Microprocessor With RISC Architecture.",Jun. 30, 2006.*

(Continued)

*Primary Examiner*—Linh V Nguyen
(74) *Attorney, Agent, or Firm*—Kevin D. Jablonski; Graybeal Jackson LLP

(57) ABSTRACT

An embodiment of the invention relates to a process for compression of executable code by a microprocessor, comprising steps consisting of decomposing the executable code into words; compressing each word of executable code, each compressed word of executable code comprising a part of predefined fixed length and a part of variable length whereof the length is defined by the part of fixed length; and combining all the parts of fixed length and all the parts of variable length of the words respectively into a block of parts of fixed length and in a block of parts of variable length, the respective positions of at least certain parts of variable length in the block of parts of variable length being saved in an addressing table.

56 Claims, 5 Drawing Sheets

U.S. PATENT DOCUMENTS

2008/0126083 A1\* 5/2008 Moriya et al. .............. 704/219
2008/0320157 A1\* 12/2008 Sather et al. ................ 709/231

OTHER PUBLICATIONS

Wolfe A et al., "Executing Compressed Programs On An Embedded RISC Architecture", Microarchitecture, 1992. Micro 25., Proceedings of the $25^{th}$ Annual International Symposium on Portland, OR, USA 1-4 Cec. 1992, Los Alamitos, CA, USA, IEEE Comput. Soc. US, Dec. 1, 1992, pp. 81-91.

Lefurgy C et al., "Improving code density using compression techniques", Proceedings of the $30^{th}$ Annual IEEE/ACM International Symposium on Microarchitecture. Micro-30. Research Triangle Park, NC, Dec. 1-3, 1997, Proceedings of the Annual International Symposium on Microarchitecture, Los Alamitos, CA, IEEE Computer So, vol. $30^{th}$ Conf, Dec. 1, 1997.

French Search Report for FR 0507029 dated Apr. 4, 2006.
French Search Report for FR 0507028 dated Apr. 3, 2006.

\* cited by examiner

METHOD AND APPARATUS FOR COMPRESSION AND DECOMPRESSION OF AN EXECUTABLE CODE WITH A RISC PROCESSOR

PRIORITY CLAIM

The present application claims the benefit of French Patent Application Serial Nos.: 0507028 and 0507029, filed Jul. 1, 2005, which applications are incorporated herein by reference in their entireties.

RELATED APPLICATION DATA

This application is related to the U.S. patent application Ser. No. 11/480,781 entitled METHOD AND APPARATUS FOR COMPRESSION AND DECOMPRESSION OF AN EXECUTABLE CODE BY A MICROPROCESSOR WITH RISC ARCHITECTURE AND RELATED SYSTEM, filed Jun. 30, 2006, which is incorporated herein by reference in its entirety.

TECHNICAL FIELD

An embodiment of the present invention relates to the field of compression of executable code by a microprocessor.

BACKGROUND

It applies especially, but not exclusively, to code executable by RISC (Reduced Instruction Set Computer) microprocessors, as compared to microprocessors with CISC (Complex Instruction Set Computer) architecture.

Relative to microprocessors with CISC architecture, RISC microprocessors have the advantage of possessing simplified architecture, which produces notably higher execution speeds, and employing code compilers notably simpler than CISC microprocessors. In contrast, programs written for microprocessors with RISC architecture are notably more capacious, typically by 20 to 50%. The result is an increase in the loading time for a program in view of its execution, memory resources necessary for saving the program, and the necessary bandwidth if the program must be transmitted over a network.

By way of a solution to this problem, U.S. Pat. No. 5,764,994 proposes applying compression processes such as Lempel-Ziv by such microprocessors to the executable code, based on the detection of repetitions of patterns, the compressed code then being decompressed on the fly at the moment of its execution by the microprocessor. All the same, such a code is difficult to be compressed due to the fact of the presence in the instructions of executable RISC code of redundant fields which contain no information, but reduce the efficacy of the data model constructed during compression. In addition, the instructions of executable RISC code have different formats, and utilise numerous registers and literal values, which make detection of repeated patterns in the code difficult.

The U.S. Pat. No. 6,618,506 and U.S. Pat. No. 6,199,126 provide decomposing the executable program to be compressed into two subsets respectively comprising the field of operating code and the operating field of each instruction, then conducting statistical analysis of each subset to evaluate frequencies of appearance of symbols. Next, each symbol is attributed a code whereof the size is smaller for those symbols having a high frequency of appearance in the subset, and a correspondence table between the symbols and the codes attributed to the symbols is made. Each code comprises a prefix associated with either an index or the value of the symbol according to the value of the prefix. In the case where the prefix is followed by an index, the prefix designates a group of symbols in the correspondence table and the index specifies the position of the corresponding symbol in the group. Finally, each field of instructions of the executable code is replaced by the corresponding code such as specified in the correspondence table to obtain the program in compressed form.

To optimize the memory place occupied by the compressed program, the codes of variable length are saved one after another without being aligned on memory words. To be able to be decompressed on the fly from an instruction address required by the microprocessor, the program is compressed by blocks of 64 octets (16 instructions of 32 bits), and an index table is generated for directly accessing each compressed block.

It proves that this solution degrades the performances in terms of speed of execution of the program. This degradation comes from the fact that the compressed instructions are of variable size and thus it is not possible to decompress an instruction of a block prior to having determined the length of the preceding compressed instruction. This solution thus does not conduct certain decompression operations in parallel.

This solution is not optimum in terms of occupation of memory. In fact, it is necessary for each block of compressed instructions to be aligned on the words memory of the addressing space, which leaves at the end of each bloc unoccupied locations all the greater than the selected blocks are large or all the more numerous than the blocks are selected small. In addition, the index table is relatively voluminous since it occupies 32 bits (4 octets) per block of 64 octets, which significantly penalises the efficacy of compression.

An embodiment of the present invention eliminates these disadvantages. This is attained by the provision of a compression process of executable code by a microprocessor, comprising steps consisting of decomposing the executable code into words, and compressing each word of executable code.

SUMMARY

According to an embodiment of the invention, each word of compressed executable code comprises a part of predefined fixed length and a part of variable length whereof the length is defined by the part of fixed length, the process further comprising a step consisting of combining all the parts of fixed length and all the parts of variable length of the words respectively into a block of parts of fixed length and into a block of parts of variable length, the respective positions of at least certain parts of variable length in the block of parts of variable length being saved in an addressing table.

According to an embodiment of the invention, the executable code is divided into lines of a predefined number of instructions, each line of executable code being compressed into a line of parts of fixed length featuring in the block of parts of fixed length, and a line of parts of variable length featuring in the block of parts of variable length, each of the lines of parts of variable length being localised in the block of parts of variable length by means of the addressing table.

The addressing table comprises one input per group of a predefined number of lines of parts of variable length, each input specifying the position of a first line of parts of variable length in the set of parts of variable length of the compressed code, and the respective lengths of the lines of parts of variable length of the group, except for a last line of parts of variable length of the group, whereof the length is determined by means of the position of a first line of parts of variable length of a group of lines of parts of following variable length.

Each of the words of the executable code to be compressed preferably corresponds to an instruction.

According to an embodiment of the invention, the executable code is split into several parts, each containing a respective word of each instruction of the executable code to be compressed, the process being applied separately to each of the parts of executable code, to obtain for each word of instruction of the executable code a part of fixed length which is inserted into the block of parts of fixed length and a part of variable length which is inserted into the block of parts of variable length.

According to an embodiment of the invention, the compression step comprises steps consisting of:
- constituting a histogram giving for each distinct word of the executable code a number of occurrences of this word in the executable code, and
- extracting at least part of the words of the histogram in a decompression table, in which the words are distributed into sub-tables collecting words having numbers of close occurrences in the histogram, each sub-table being associated with a predefined length,
- the part of fixed length of each word of the executable code referencing a sub-table of the decompression table, and the part of variable length giving a position in the sub-decompression table of the word of the executable code.

According to an embodiment of the invention, the words of the executable code associated in the histogram with a number of occurrences less than a predetermined threshold are not inserted into the decompression table, each word of executable code not inserted into the decompression table being compressed by means of a part of fixed length specifying that the word of executable code does not feature in the decompression table, and a part of variable length containing at least a part of the word of executable code.

According to an embodiment of the invention, if two words of identical executable code appear consecutively in the executable code to be compressed, the second word of executable code is compressed without a part of variable length, by means of a part of fixed length specifying that the word of executable code is the same as the preceding word.

According to an embodiment of the invention, the part of fixed length of each compressed word specifies, according to its value
- either a number of sub-table of the decompression table,
- or that the word of the corresponding executable code is the second word of two identical consecutive words of the executable code,
- or that the part of variable length of the compressed word contains at least a part of the word of corresponding executable code.

According to an embodiment of the invention, a predefined value of the part of fixed length of a compressed word specifies a stop point to be introduced to the executable code during a test phase of the program.

According to an embodiment of the invention, the division into sub-tables of the decompression table is selected so as to produce the smallest possible size of the set of parts of variable length of the compressed code.

According to an embodiment of the invention, the executable code is split into several parts, each containing a respective word of each instruction of the executable code to be compressed, the process being applied separately to each of the parts of executable code, to produce a decompression table for each part of the executable code.

An embodiment of the invention likewise relates to a decompression process of executable code by a microprocessor, saved in a program memory zone in compressed form, the process comprising steps consisting of:
- receiving from the microprocessor instruction requests of executable code comprising an instruction address to be executed,
- determining a reading address of an addressing table as a function of the instruction address to be executed,
- reading to the reading address in the addressing table addressing information of compressed words corresponding to the instruction to be executed,
- determining a reading address of the program memory as a function of the addressing information read,
- reading the program memory to the reading address, and
- decompressing the words read and transmitting them to the microprocessor.

According to an embodiment of the invention, each word of the executable code is compressed in the form of part of predefined fixed length and a part of variable length whereof the length is defined by the part of fixed length, all the parts of fixed length and all the parts of variable length of the words of executable code being respectively combined into a block of parts of fixed length and into a block of parts of variable length, at least certain parts of variable length being localised in the block of parts of variable length by means of an addressing table, the decompression process further comprising steps consisting of:
- determining a reading address in the block of parts of fixed length as a function of the address of the instruction to be executed,
- reading the blocks of parts of fixed and variable length to the determined reading addresses, and
- decompressing the parts of fixed and variable length read to obtain an executable instruction which is transmitted to the microprocessor.

According to an embodiment of the invention, the compressed code is organised into lines of parts of fixed length and into lines of parts of variable length, each line of parts of fixed length and the line of associated parts of corresponding variable length to a respective line of a predefined number of instructions of executable code, each of the lines of parts of variable lengths being localised in the program memory zone by means of the addressing table, the process comprising steps of:
- reading a line of parts of fixed length and a line of parts of variable length, localised by means of information read in the addressing table, and
- decompression of the lines of parts of fixed and variable length read to produce a line of executable instructions.

According to an embodiment of the invention, the addressing table comprises one input per group of a predefined number of lines of parts of variable length, each input specifying the position of a first line of parts of variable length in the set of parts of variable length of the compressed code, and the respective lengths of the lines of parts of variable length of the group, except for a last line of parts of variable length of the group, whereof the length is determined by means of the position of a first line of parts of variable length of a group of lines of parts of following variable length.

According to an embodiment of the invention, the part of fixed length of each compressed instruction references a sub-table of a decompression table collecting at least part of the words of the executable code, the part of variable length giving the position in the sub-table of the word of executable code, the decompression of a part of fixed length and a part of corresponding variable length comprising steps of:

determining the length of the part of variable length as a function of the value of the part of corresponding fixed length, reading the part of corresponding variable length in light of the determined length of the part of variable length, and if the part of fixed length references a sub-table of the decompression table, reading the word of executable code in the sub-table of the decompression table referenced by the part of fixed length read at a position defined by the part of variable length read.

According to an embodiment of the invention if the part of fixed length indicates that the word of corresponding executable code is a second word of two identical words appearing consecutively in the executable code, the part of fixed length is decompressed by the word of previously decompressed executable code;

if the part of fixed length specifies that the word of corresponding executable code does not feature in the decompression table, the process further comprises the extraction steps of at least part of the word of executable code of the part of corresponding variable length to the part of fixed length; and if the part of fixed length specifies a stop point, a stop point is inserted into the decompressed executable code.

Each of the words of decompressed executable code corresponds to an instruction.

Alternatively, the executable code is split into several parts, each containing a respective word of each instruction of the executable code to be compressed, each part of the executable code having been compressed separately and being associated with a respective decompression table collecting words of executable code of the part of the executable code.

An embodiment of the invention likewise relates to a decompression unit of executable code by a microprocessor, saved in a program memory zone in compressed form, the decompression unit being connected to the microprocessor, the decompression unit comprising:

means for receiving from the microprocessor instruction requests of executable code comprising an instruction address to be executed, means for determining a reading address of an addressing table as a function of the instruction address to be executed, the addressing table localising in the program memory certain compressed words saved, means for reading to the reading address in the addressing table addressing information of compressed words corresponding to the instruction to be executed, means for determining as a function of the addressing information read a reading address of the program memory, means for reading compressed words in the program memory to the reading address, means for decompressing the compressed words read for obtaining an executable instruction, and means for transmitting to the microprocessor the executable instruction.

According to an embodiment of the invention, each word of the executable code is compressed in the form of a part of predefined fixed length and a part of variable length, whereof the length is defined by the part of fixed length, all the parts of fixed length and all the parts of variable length of the words of executable code being combined into a program memory zone respectively in a block of parts of fixed length and in a block of parts of variable length, at least certain parts of variable length being localised in the block of parts of variable length by means of an addressing table, the decompression unit further comprising:

means for determining a reading address in block of parts of fixed length as a function of the address of the instruction to be executed, means for reading the block of parts of fixed length to the determined reading address, and means for decompressing the parts of fixed and variable length read to produce an executable instruction.

According to an embodiment of the invention, the decompression unit further comprises means for saving starting addresses of the block of parts of fixed length and of the block of parts of variable length of the compressed code.

According to an embodiment of the invention, the compressed code is organised into lines of parts of fixed length and into lines of parts of variable length, each line of parts of fixed length and the line of parts of associated variable length corresponding to a respective line of a predefined number of instructions of executable code, each of the lines of parts of variable lengths being localised in the program memory zone by means of an addressing table saved in a zone of the program memory, the decompression unit further comprising means for saving a starting address of the addressing table.

According to an embodiment of the invention, the addressing table comprises one input per group of a predefined number of lines of parts of variable length, each input specifying the position of a first line of parts of variable length in the set of parts of variable length of the compressed code, and the respective lengths of the lines of parts of variable length of the group, except for a last line of parts of variable length of the group, whereof the length is determined by means of the position of a first line of parts of variable length of a group of lines of parts of following variable length, the decompression unit further comprising:

means for receiving from the microprocessor instruction requests of executable code comprising an instruction address, means for reading the addressing table as a function of the instruction address of executable code provided by the microprocessor, means for determining by means of the addressing table the position in the program memory of the line of parts of fixed length containing the words of compressed code corresponding to the instruction address provided by the microprocessor, means for determining by means of the addressing table the position and the length in the program memory of the line of parts of variable length containing the words of compressed code corresponding to the instruction address provided by the microprocessor, and means for decompressing and saving all the instructions of executable code corresponding to the line of parts of read fixed length and to the line of parts of variable length read.

According to an embodiment of the invention, the decompression unit further comprises:

a memory cache for saving a predefined number of decompressed instructions, means for reading the memory cache following receipt of an instruction request sent by the microprocessor, and for transmitting in response the corresponding instructions if they are located in the memory cache.

According to an embodiment of the invention, at least certain parts of fixed length reference a sub-table of a decompression table collecting at least part of the words of the executable code, the part of variable length giving the position in the sub-table of the word of executable code, the decompression unit further comprising:

means for saving a decompression table, means for determining the position of the word of executable code to be read in the decompression table from the part of fixed length and the part of variable length, if the part of fixed length references a sub-table of the decompression table, and means for reading the word of executable code to the positions determined in the sub-table.

According to an embodiment of the invention, the decompression unit further comprises means for transmitting to the microprocessor a word of executable code previously decompressed if the part of fixed length indicates that the word of corresponding executable code is a second word of two identical words appearing consecutively in the executable code.

According to an embodiment of the invention, the decompression unit further comprises means for transmitting to the microprocessor the part of read variable length if the part of fixed length specifies that the word of corresponding executable code does not feature in the decompression table.

According to an embodiment of the invention, the decompression unit further comprises means for transmitting to the microprocessor a stop point of program execution, if the part of fixed length specifies it.

According to an embodiment of the invention, each of the words of decompressed executable code corresponds to an instruction.

According to an embodiment of the invention, the executable code is split into several parts each containing a respective word of each instruction of the executable code to be compressed, each part of the executable code having been compressed separately and being associated with a respective decompression table collecting words of executable code of the part of the executable code.

An embodiment of the invention likewise relates to a microprocessor comprising a decompression unit such as defined hereinabove.

BRIEF DESCRIPTION OF THE DRAWINGS

One or more embodiments of the invention will be described hereinafter, by way of non-limiting example, with reference to the attached diagrams, in which.

DETAILED DESCRIPTION

Figure 1:
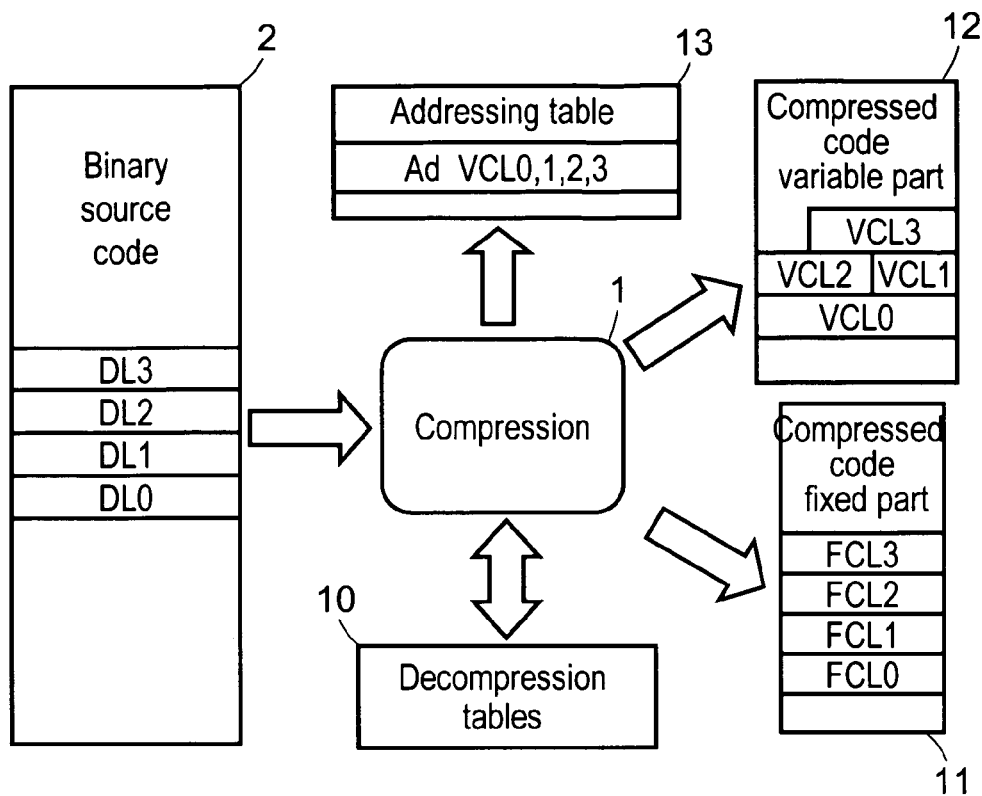
FIG. 1 schematically illustrates a compression system of binary source code, according to an embodiment of the invention.

In FIG. 1, the compression system 1 according to an embodiment of the invention is designed to process binary source code 2, that is, executable by a microprocessor, to produce the compressed code. The compression algorithm is selected such that each word of the executable code is compressed in the form of a part of fixed length and a part of variable length. This algorithm is of the variable length type, based on the frequency of appearance of the different words in the code to be compressed, short codes being attributed to the most frequent words to be compressed, and longer codes to the least frequent words to be compressed. The selected algorithm originates for example from the Huffman method.

Next, all the parts of fixed length are combined into a block 11 of compressed instructions fixed length, and all the parts of variable length are combined into a block 12 of compressed instructions of variable length, an addressing table 13 being constituted to access the compressed instructions in the block 12 of compressed instructions of variable length without having to read and decompress all the preceding instructions in the block.

In this way, the position in memory of the fixed part of an instruction can be determined directly as a function of the address of the instruction in the executable code, which enables decompression to process the parts of fixed and variable length in parallel.

Figure 2:
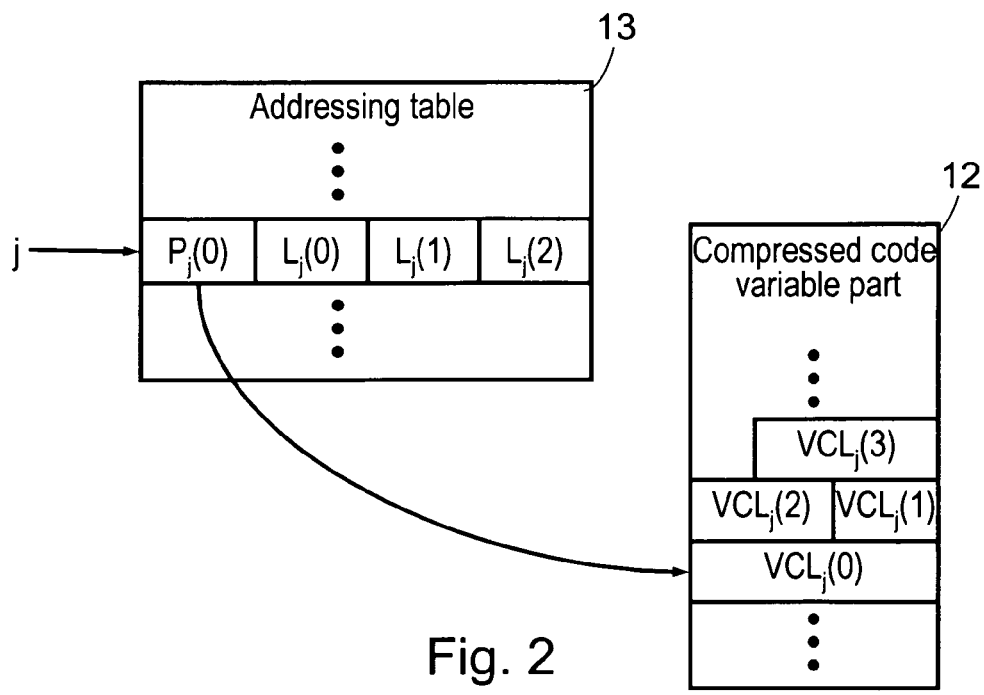
FIG. 2 shows the structure of an addressing table according to an embodiment of the invention obtained during compression.

The source code to be compressed is processed by lines DL of 32 or 64 instructions, each line DL resulting in the production of a line of fixed parts FCL and a line of variable parts VCL. In this context, the addressing table 13 is structured as illustrated in FIG. 2 in addressing words referencing a group j of several lines of variable parts, for example 4: $VCL_j(0)$, $VCL_j(1)$, $VCL_j(2)$ and $VCL_j(3)$. Each addressing word saved in the addressing table 13 comprises the position $P_j(O)$ in number of bits in the variable part 12 of the start of a first line $VCL_j(0)$, and the lengths $L_j(0)$, $L_j(1)$, $L_j(2)$ in number of bits, of the first, second and third lines $VCL_j(0)$, $VCL_j(1)$ and $VCL_j(2)$.

The respective positions $P_j(1)$, $P_j(2)$, $P_j(3)$ in number of bits of the second, third and fourth lines $VCL_j(1)$ $VCL_j(2)$ and $VCL_j(3)$ are obtained by adding the position $P_j$ and the length $L_j$ of the fixed part of the line preceding:

$$P_j(k)=P_j(k-1)+L_j(k-1), \text{ for k=1 to 3} \quad (1)$$

The length $L_j(3)$ of the fourth line $VCL_j(3)$ is deduced from the position of the first line $P_{j+1}(0)$ specified in the addressing word referencing the group j+1 of the four following lines, and of the position $P_j(3)$ of the fourth group:

$$L_j(3)=P_{j+1}(0)-P_j(3) \quad (2)$$

Each word j of the addressing table 13 comprises for example 64 bits distributed in the different fields in the following manner:

Bits 63 to 33: $P_j(0)$

Bits 32 to 22: $L_j(0)$

Bits 21 to 11: $L_j(1)$

Bits 10 to 0: $L_j(2)$

The addressing table 13 thus directly accesses a line VCL of variable parts of compressed instructions. In comparison to the addressing tables described in U.S. Pat. No. 6,199,126, the addressing table according to an embodiment of the invention addresses four lines of 32 or 64 instructions of 32 bits by means of words of 64 bits, which increases in a relatively low measure the size of the compressed code.

Figure 3:
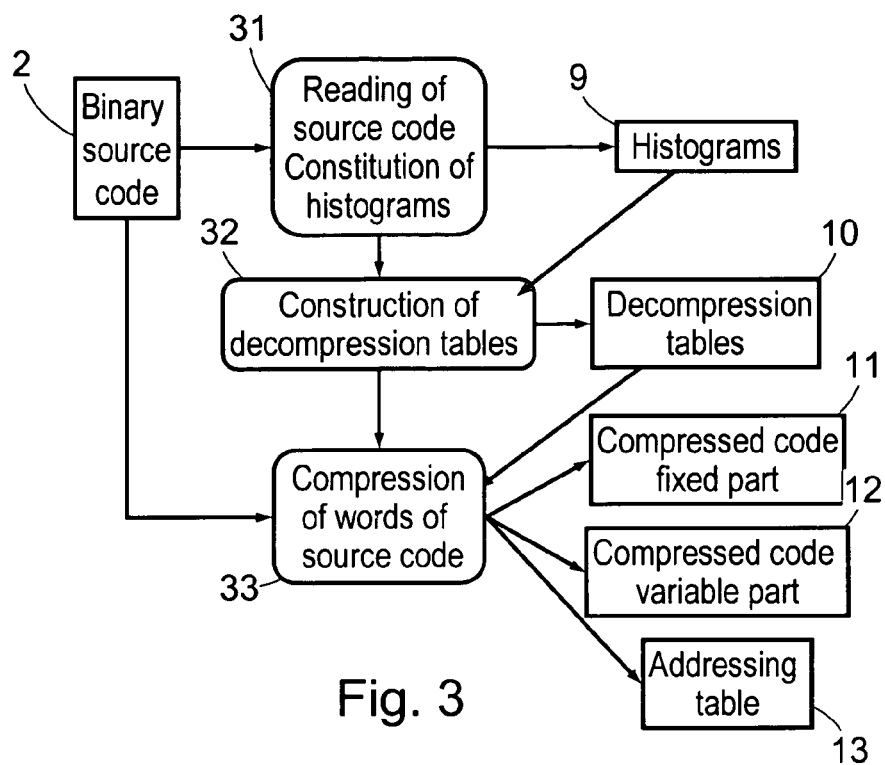
FIG. 3 shows in greater detail in the form of an organigram a sequence of compression procedures executed by the system illustrated in FIG. 1.

The selected compression algorithm for example complies with that illustrated in FIG. 3. In the first step 31 of this algorithm, the system 1 reads the binary source code to constitute a histogram giving for each distinct word of the source code a number of occurrences in the source code of this word. This histogram is constituted by a table ordered by a decreasing number of occurrences.

In the following step 32, the system constructs a decompression table 10 extracted from the histogram by collecting all the distinct associated words in the histogram to a number of occurrences greater than a predefined threshold. The order of the words in the decompression table corresponds to that of the words in the histogram. The decompression table is then divided into sub-tables collecting words having numbers of close occurrences, that is, whereof the position in the sub-table will be coded by the same number of bits.

In the following step 33, the binary source code 2 is read again, to compress each word of the binary code in the form of a part of fixed length, constant for all the words of the executable code to be compressed, and a part of variable length from one word to the other. There are two cases according to which the word to be compressed is or is not in the compression table.

Figure 4:
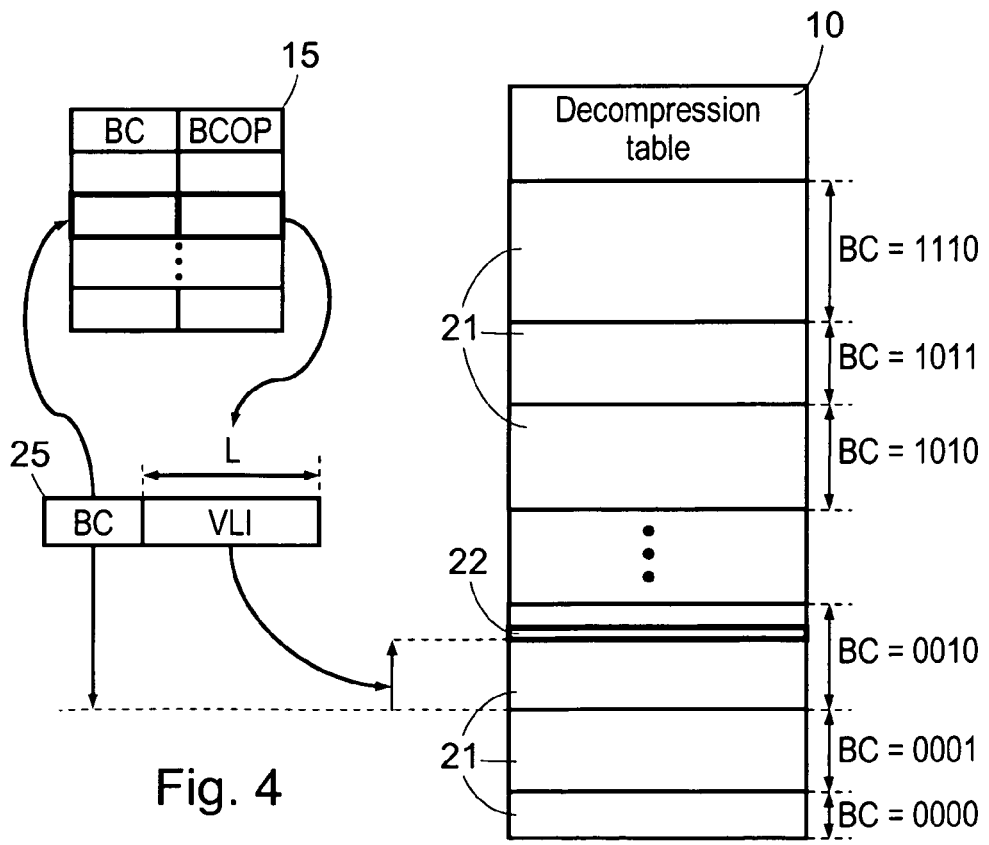
FIG. 4 shows the structure of a decompression table obtained during compression carried out according to the sequence of procedures illustrated in FIG. 3.

If the word to be compressed is in the compression table 10, the compression principle illustrated by FIG. 4 which shows the decompression table 10 divided into sub-tables 21, each referenced by a respective BC code, is applied. According to this principle, the fixed part of the word 25 resulting from the compression contains the sub-table BC code of the decompression table 10 in which the word 22 is found in the decompressed state, and the variable part indicates the position VLI of this word in the sub-table. in the example of FIG. 4, the sub-table BC code is coded on 4 bits, so as to reference as many as 16 sub-tables. In practice, certain values of the BC code will have to be reserved for other usages such as coding the words of the source code not present in the compression table 10.

If the word to be compressed is not in the compression table 10, the fixed part of the word resulting from compression contains a number BC not attributed to a sub-table 21, reserved for this effect, and the variable part contains the word to be compressed.

If two values of the BC code can be reserved for coding the words to be compressed not in the compression table, a bit in the coding of the word can be won by considering that a bit of the BC code determines a bit of the word to be compressed. For example, the bit of low weight of the BC code is equal to the bit of heavy weight of the word to be compressed.

Advantageously, a value of the BC code is reserved for specifying that the word to be compressed is the same as the preceding word. In this way, if the source code to be compressed comprises two identical successive words, the second word is coded without variable part, in the form of a single fixed part including the reserved BC code, specifying that the word of the source code is the same as the preceding word.

Advantageously, the division of the decompression table 10 into sub-tables 21 is completed so as to minimise the size of the compressed code and in particular the length of the variable part 12 of the compressed code, knowing that the length of the fixed part 11 of the compressed code depends on the number of instructions featuring in the source code to be compressed and on the length (in number of bits) selected for the BC code.

The BC code has the following functions: either it specifies a sub-table number, or it introduces a word of the non-compressed code, or it specifies that the word which it codes is identical to the preceding word. Provision can further be made to reserve a value of the BC code for introducing stop points to the binary source code during a test phase of the program.

The function of the BC code as a function of its value is advantageously defined in a table 15 indexed as a function of the value of BC, specifying either the length L in number of bits of the variable part VLI when BC specifies a number of sub-table 21, or the length of the non-compressed word when BC introduces a non-compressed word, or when the word introduced by the BC code is identical to the preceding word, or when the value of corresponding BC is a stop point.

The size T of the variable part 12 of the compressed code is obtained by the following formula:

$$T = \sum_{i=0}^{N-1} V_i \cdot \sum_{j=H_i}^{H_{i+1}} O_j + (M - H_N) \cdot V_{literal} \quad (3)$$

in which:

N is the number of sub-tables 21 in the decompression table 10, $V_i$ ($0 \leq i \leq N$) is the number of bits selected for the coding of the position of a word in the sub-decompression table i (is directly linked to the number of words listed in the sub-table i), $H_i$ is the position in the decompression table i (or in the histogram) of the first word of the sub-table i, $O_j$ is the number of occurrences of the $j^{th}$ word of the decompression table (or of the histogram), such as provided in the histogram 9, M is the number of words in the histogram, $H_N$ is the size in number of words of the decompression table, or the position of the first word in the histogram which does not feature in the decompression table, and $V_{literal}$ being the length of coding of a word of the code to be compressed was not found in the decompression table.

$H_N$ can be calculated by means of the following formula $$H_N = \sum_{i=0}^{N-1} 2^{V_i} \quad (4)$$

If S is the maximum size reserved for the decompression table 10, $H_N \leq S$.

If two values of the BC code can be reserved for coding the words to be compressed not in the compression table, formula (3) becomes $$T = \sum_{i=0}^{N-2} V_i \cdot \sum_{j=H_i}^{H_{i+1}} O_j + (M - H_N) \cdot (V_{literal} - 1) \quad (5)$$

In similar fashion, if a value of the BC code can be reserved for specifying that the word to be compressed is the same as the preceding word, the formula (3) becomes:

$$T = \sum_{i=0}^{N-2} V_i \cdot \sum_{j=H_i}^{H_{i+1}} O'_j + (M - H_N) \cdot V_{literal} \quad (6)$$

The histogram is modified because two identical consecutive words count only as one for the number of occurrences of this word. This results in considering a new histogram and a number of occurrences $O'_j$.

By combining the two preceding conditions (reservation of two values of the BC code for coding the words to be compressed not found in the compression table and a value of the BC code for specifying that the word to be compressed is the same as the preceding word), the formula (1) becomes $$T = \sum_{i=0}^{N-3} V_i \cdot \sum_{j=H_i}^{H_{i+1}} O'_j + (M - H_N) \cdot (V_{literal} - 1) \qquad (7)$$

Using formulas (3), (5), (6) and (7), T applied to the code to be compressed is calculated for all possible partitions of the decompression table into sub-tables, that is, for all possible values of $H_i$, by imposing that $V_i \leq V_{i+1}$, that is, that the size of the sub-table i is less than or equal to that of the sub-table i+1. The selected partition of the decompression table into sub-tables is what produces a size T of minimum variable part. The components $V_i$ of the compression model are thus determined.

Figure 5:
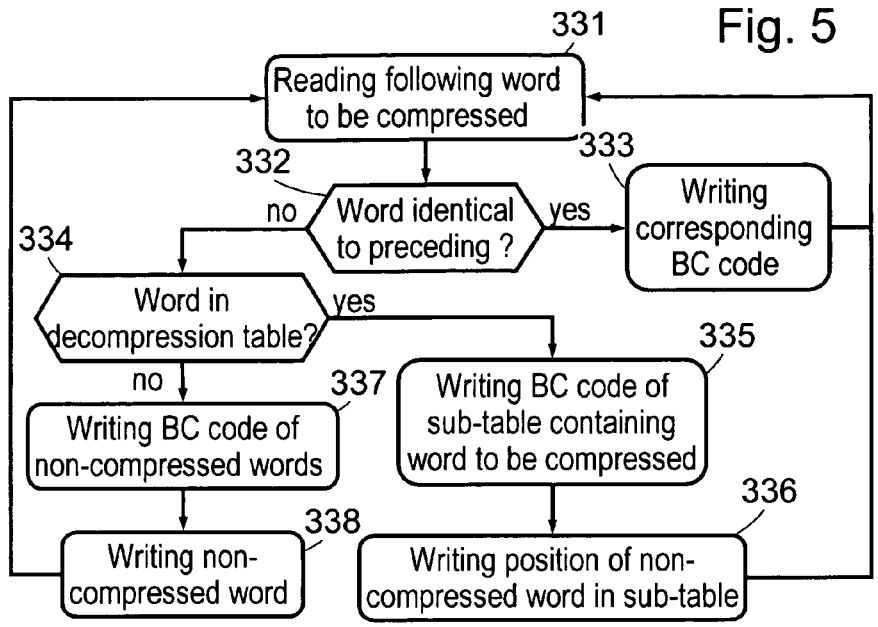
FIG. 5 shows in greater detail in the form of an organigram a step of the compression process illustrated in FIG. 3.

The compression procedure 33 of the words of the code to be compressed is illustrated in FIG. 5. In the first step 331 of this procedure, the following word of the code to be compressed is read. If this word is identical to the preceding word (step 332), the BC code corresponding in the compressed code is written to step 333, then follows step 331 for reading the following word to be compressed.

If the word to be compressed is not identical to the previous one, it is determined in step 334 if the word to be compressed figures in the decompression table 10. If such is the case, the BC code corresponding to the sub-table 21 is inserted at step 335 where the word to be compressed in the compressed code is found. Next, the position of the word to be compressed in the sub-table 21 (step 336) is inserted into the compressed code, and step 331 follows.

If the word to be compressed does not feature in the decompression table 10, the corresponding BC code (step 337) is inserted into the compressed code, then the word to be compressed or a part thereof if the selected BC code specifies the non-inserted bits of the word to be compressed (step 338).

Advantageously, each instruction of the binary source code to be compressed can be split into several words so as to reveal more repetitions in the words to be compressed. As many decompression tables as there are words in each instruction are made up. Therefore, for example, in the case of a binary code executable by a microprocessor with RISC architecture constituted by instructions coded on 32 bits, each instruction is split into two words, namely a word of heavy weight and a word of light weight, for example of lengths equal to 16 bits. These words are advantageously processed separately to constitute two respective histograms, one for the words of light weight and one for the words of heavy weight. Each of these histograms results in two decompression tables and compression of the source code to be compressed provides two fixed parts and two variable parts for each instruction of the executable code.

Figure 6:
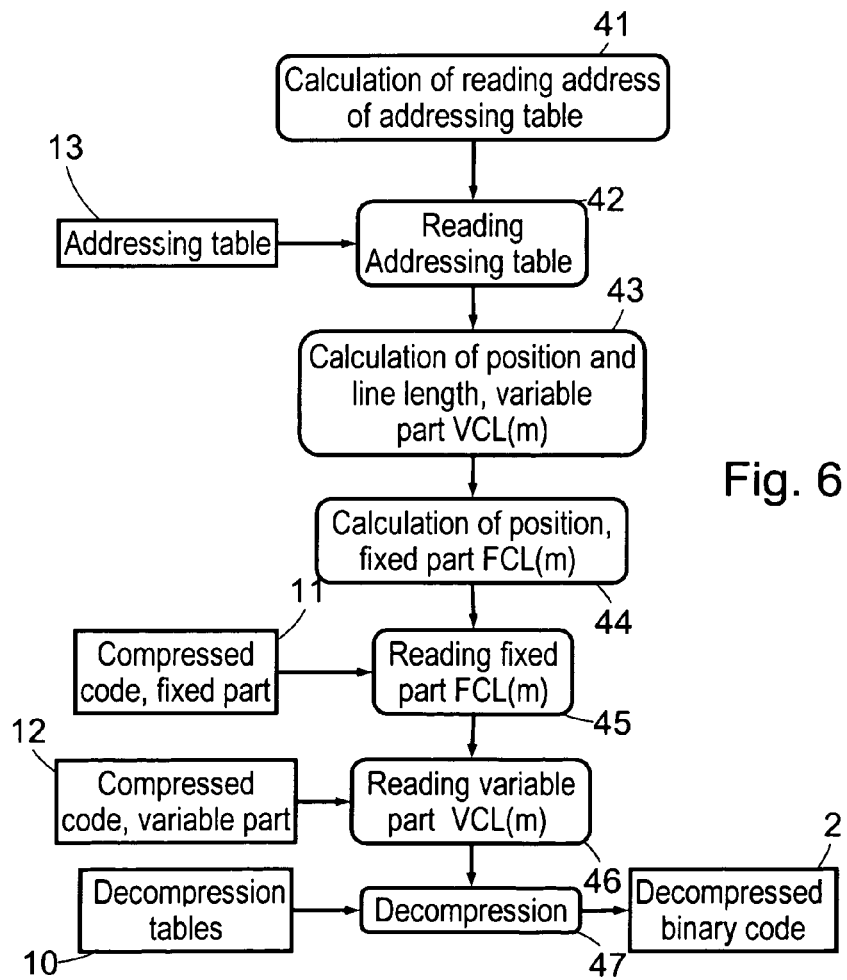
FIG. 6 illustrates in the form of an organigram a decompression process according to an embodiment of the invention.

FIG. 6 illustrates the decompression process corresponding to the compression process described hereinabove with reference to FIG. 3.

In the first step 41 of this process, an address j for reading the addressing table 13 is calculated from the address AD of a first instruction to be executed. This step first of all consists of determining the address m of the line of instructions DL(m) containing the instruction from which the decompression processing must be carried out. This calculation is done by means of the following formula:

$$m = (AD - AD_S)/DLS \qquad (8)$$

in which $AD_S$ is the starting address of the compressed program and DLS is the length of a line of instructions.

The line j of 64 bits to be read in the addressing table is obtained by dividing m by the number of lines DL referenced by line j of the addressing table, or 4 in the example described previously.

In the following step 42, the line j identified in the addressing table 13 is read, then the position of the line of instructions VCL(m) in the variable part 12 of the compressed code is determined, and the number of words to be read to produce all the compressed code of the line of instruction of variable length (step 43).

The position P(m) of the line m to be read in the variable part 12 is obtained in the following way:

if k=m modulo 4=0, $$P(m) = P_j(0), \qquad (9)$$

unless, if k=1, 2 or 3, $$P(m) = P_j(k-1) + L_j(k-1). \qquad (10)$$

Once it has been identified to which line m belongs, the variable part of the instruction to be read the number F of words (of 32 bits) to be read in the variable part is determined as a function of the number of line m, by means of the following formula:

$$F(m) = 1 + (L_j(k) - 1)/32 \qquad (11)$$

In the following step 45, the fixed part FCL(m) of the line of compressed code DL(m) is read. Knowing that the fixed part of a compressed instruction is coded on 8 bits (if the BC codes are defined on 4 bits and if each instruction is decomposed into two words of 16 bits codes separately), the position $P_F$ in octets of the line of code in the compressed fixed part 11 is given the value m. The length of the fixed part FCL(m) is 32 or 64 octets according to the length of a line.

In the following step 46, the variable part VCL(m) of the line of compressed code is read, determined at step 44. Of course, steps 44 and 45 on either side of 42, 43 and 46, can be taken in any order or in parallel.

Finally, in the final step 47, the line of compressed code is decompressed by means of the decompression tables to produce a line of executable code 2'. To this effect, each BC code of the line of fixed length FCL(m) is read, the function of the BC code is determined by accessing the field BCOP<BC> in the table 15, if the function of the BC code specified in the table 15 indicates that the corresponding instruction is the same as the preceding instruction, the previously decompressed instruction is duplicated in the decompressed code 2'. If the function of the BC code specified in the table 15 is to introduce a non-compressed variable part of 15 or 16 bits, the following 15 or 16 bits in the variable part VCL(m) are read respectively and are written into the decompressed code 2'. If the length of the variable part is 15 bits, the bit of heavy weight (16th bit) is equal to the bit of light weight of the BC code. If the function of the BC code is to reference a sub-table of the decompression table 10, the address of the corresponding sub-table 21 in the decompression table is determined, and the length VLI of the variable part to be read in the line of variable parts VCL(m), such as specified in the table 15. The following VLI bits in the variable part VCL(m) are read to produce a position to be read in the decompression table 10 from the address of the sub-table 21 corresponding to the BC code. Finally, the word 22 found at the position thus determined in the sub-decompression table 21 is read, the read word being inscribed in the decompressed code 2'.

Figure 7:
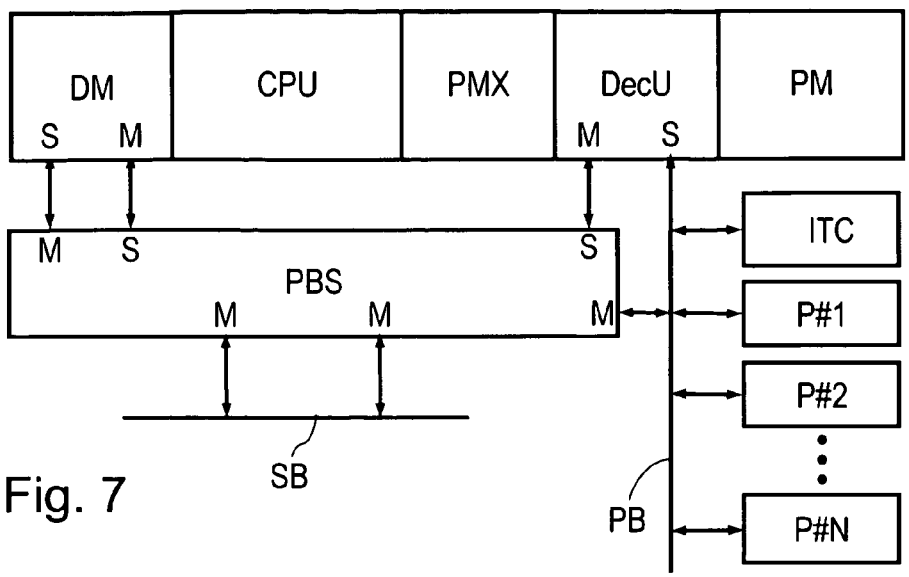
FIG. 7 schematically represents the architecture of a calculator comprising a decompression unit according to an embodiment of the invention.

The decompression process which has just been described is adapted to be carried out on the fly at the moment of execution of a program by a microprocessor or microcontroller. FIG. 7 schematically illustrates an example of architecture of an integrated circuit comprising such a microprocessor. In this figure, the microprocessor comprises a central unit CPU coupled directly to an access unit DM with data memory, and to an access unit with PMX program memory designed to accelerate reading the instructions to be executed in a PM program memory with rapid access or optionally in other memories, accessible by means of a peripheral bus PB, to which are connected an administration unit for ITC interruptions and peripheral elements P#1, P#2, . . . , P#N such as memories. The integrated circuit further comprises a PBS bus switch forming a link between the microprocessor, and in particular the access unit DM with data memory, and the PMX access unit with program memory and a SB bus access system with external memories and external interfaces.

Figure 8:
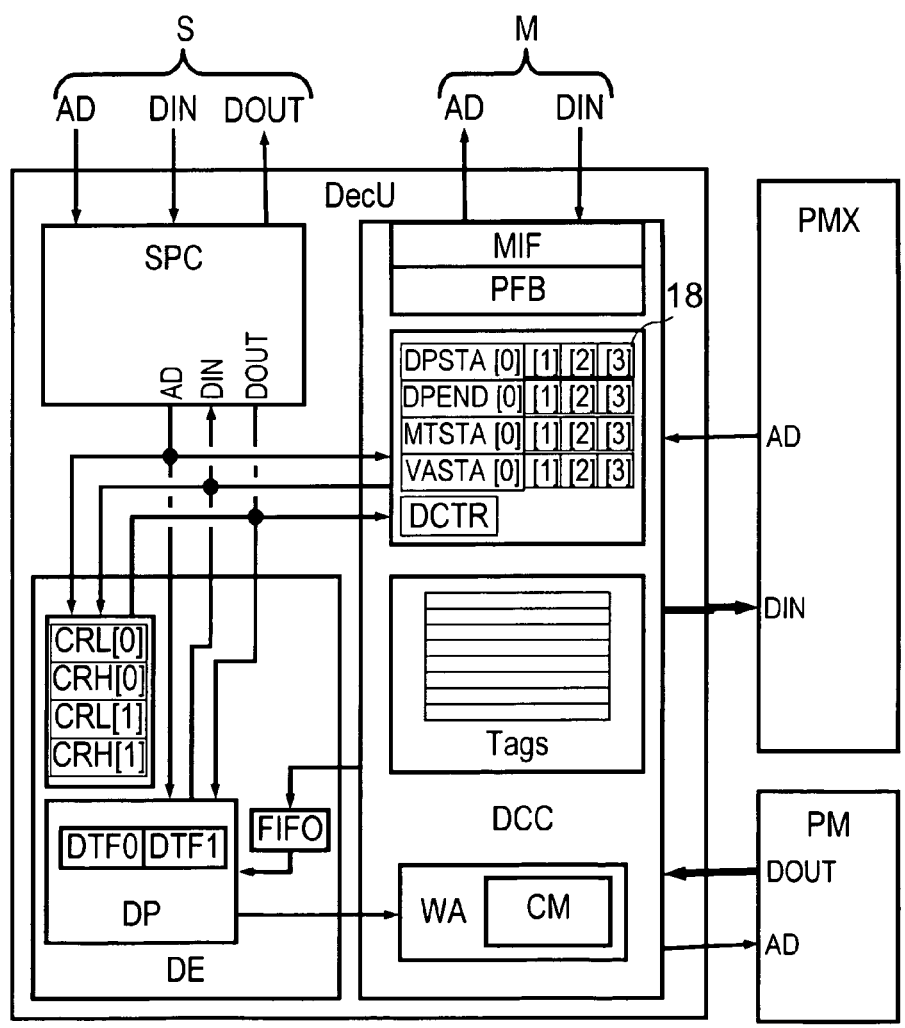
FIG. 8 schematically represents the architecture of the decompression unit shown in FIG. 7.

According to an embodiment of the invention, the microprocessor comprises a DecU decompression unit for decompressing on the fly of the executable code saved in the program memory in compressed form obtained due to the compression process described hereinabove. To this end, the decompression unit is interposed between the access unit with PMX program memory on either side, the PM program memory, the PBS bus switch and the PB peripheral bus. An example of architecture of the decompression unit is represented in FIG. 8. In this figure, the DecU decompression unit comprises an SPC slave port control circuit charged with communications with the PB peripheral bus and initialisation of the DecU decompression unit, a DE decompression motor charged with processing of decompression per se, and a DCC memory cache control circuit.

The DE decompression motor comprises CRL, CRH registers for receiving the table 15 for giving the function of the BC code for each of the values of this code. The decompression motor further comprises a DP processing unit collecting in DTF registers the decompression tables 10. If the instructions of code are split into two words, two tables 15 saved into four registers CRL[0], CRL[1], CRH[0], CRH[1] are provided, and two decompression tables saved respectively into two DTF0 and DTF1 registers. More generally, two CRL, CRH registers and a DTF register for each compressed word separately from the instructions of the executable code are provided. The DP processing unit advantageously has a pipeline architecture, that is, it can carry out in parallel several operations normally conducted in series.

The DCC memory cache control circuit comprises
 an MIF master bus interface designed to be connected to the PBS bus switch,
 a PFB input buffer memory connected to the MIF interface,
 a set of registers 18 provided to receive addresses accessing the different parts of the compressed code saved in the program memories, namely the fixed 11 and variable 12 parts of the compressed code and the addressing tables 13,
 a DCTR control register of the decompression unit,
 a WA memory work zone comprising a CM memory cache, and
 an administration Tags table of the CM memory cache containing the addresses of the most recent decompressed instructions saved in the CM memory cache.

The SPC circuit comprises an AD input address port, and DIN and DOUT data input and output ports connected to the PB peripheral bus, especially for receiving from the CPU by way of the PBS bus switch the data to be loaded into the different registers described hereinabove of the decompression unit for carrying out decompression processing. It is likewise responsible for conducting the tests for proper running of the DecU decompression unit and in particular to test the content of the registers.

Figure 9:
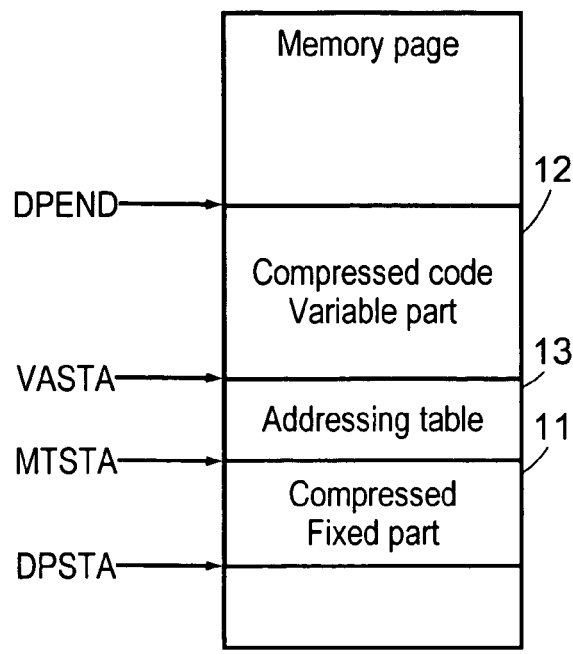
FIG. 9 shows the structure of a memory page of compressed program, according to an embodiment of the invention.

Advantageously, the compressed code is distributed in the program memory in pages of compressed code, each page collecting a fixed part 11 and a variable part 12 of compressed code, and an addressing table 13. The set of registers 18 is thus provided for receiving for each page of compressed code a set of addresses comprising page starting and finishing addresses of compressed DPSTA and DPEND code, a starting MTSTA address for addressing table 13, and a starting VASTA address of variable part 12 of the compressed code, the fixed part 11 of the compressed code extending for example from the DPSTA starting address, as illustrated in FIG. 9.

Figure 10:
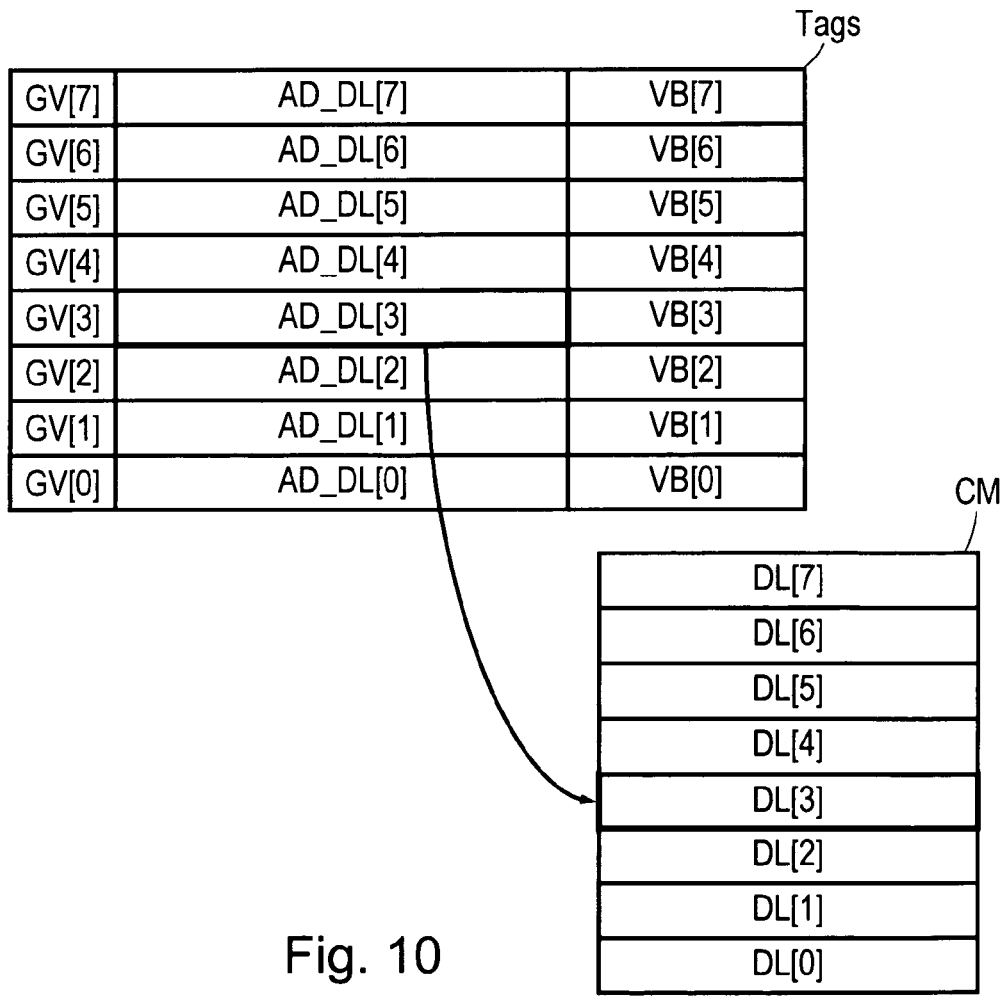
FIG. 10 shows the structure of an administration table of memory cache of the decompression unit shown in FIG. 8.

As is shown in FIG. 10, the Tags table aids in addressing 8 DL lines of decompressed instructions. Each line i of this table, which corresponds to a line i of the CM memory cache, contains the AD_DL[i] address of the decompressed line in the addressing plane of the CPU, associated with a global validity bit GL[i], and a set of validity bits VB[i], by way of one validity bit per group of 4 decompressed instructions in the DL[i] line of the CM memory cache.

The control circuit of DCC memory cache is provided to connect directly to the access unit to the PMX program memory and to the PM rapid program memory. Accordingly, the DCC circuit comprises an address input connected to an AD output address of the PMX unit for receiving from the latter a starting address of instructions to be decompressed originating from the CPU, and a data output connected to a DIN input of the PMX unit by which the DCC circuit transmits the corresponding decompressed instructions in response. The DCC circuit likewise comprises an address output and a data input connected respectively to an AD address input and a DOUT data output of the PM rapid program memory, for receiving a line of compressed instructions from the address provided. When the address received from the PMX unit is not found in the rapid program memory, the DCC control circuit accesses the external program memory by means of the MIF interface comprising an output address port and an input data port connected to the PBS bus switch.

Each address received as an instruction request from the CPU by means of the PMX unit refers to a group of four successive instructions. On receipt of such a request, the DCC control circuit searches to see if the address of the group of required instructions features in the AD_DL[i] fields of the Tags table. The DCC control circuit considers that the required instructions are decompressed in the CM memory cache if the required address is in the Tags table and if the corresponding global validity bit GL[i] is raised, and if this bit is not raised, if the validity bit VB[i][j] corresponding to the group j of required instructions is raised. If the group of required instructions features in the memory cache, the DCC control circuit reads the group of required instructions in the corresponding field i of the memory cache, the transmits to the PMX unit. It is then available for receiving a fresh request from the CPU.

In the case where the group of required instructions is not decompressed in the memory cache, the DCC control unit determines if the group of required instructions belongs or not to the field of addresses of the compressed code, that is, if the address of the group of required instructions is between the DPSTA[i] and DPEND[i] addresses of the page of code to which the address of the group of required instructions belongs. If this is not the case, the control unit accesses the PM program memory or an external memory via the master port, the address of the group of required instructions and transmits the read instructions to the PMX unit.

If the group of required instructions belongs to the field of addresses of the compressed code, the DCC control unit determines a line i of the Tags table and of the CM memory cache which it can utilise for inserting the new line of decompressed code which it is about to generate. The selected line i is for example that which was read the most recently. Next, the DCC control unit executes the decompression procedure such as described hereinabove with reference to FIG. 6. In particular, in steps 45 and 46, the DCC control unit supplies the read fixed FCL(m) and variables VCL(m) parts to the DE decompression motor, for example by means of a FIFO (First In First Out) buffer memory. As long as the FIFO is not empty, the DE decompression motor executes the step 47 decompression as such. For this purpose, it reads the fixed and variable parts of the first line introduced to the FIFO, reads the BC codes of the fixed part, successively or two by two if the compressed instructions have been split into two words, and decompresses each instruction. The decompressed instructions are provided to the DCC control unit which loads them into the line i of the CM memory cache selected previously, and discloses the Tags table, and in particular the VB[i] validity bits corresponding to the line of the memory cache, each time a group of four decompressed instructions is written in the memory cache. When an entire line of decompressed instructions is inscribed in the memory cache, the control unit discloses the GV[i] global validity bit corresponding to the line.

In parallel to this, as soon as the validity bit VB[i] of the group of instructions corresponding to the address received as an instruction request from the CPU is raised, the control unit transmits the corresponding group of instructions located in the CM memory cache to the PMX unit so that it is provided to CPU, and waits for a fresh instruction request originating from the CPU.

In parallel to this, another memory cache for storing the read words in the addressing table 13 can likewise be utilised.

Because of these arrangements, if the CPU asks for instructions featuring in the CM memory cache, it is not necessary to carry out decompression processing. Numerous processing cycles are thus economised, and the bus system is left free for other tasks.

Another result of the preceding description is that the compression and decompression algorithms according to an embodiment of the invention produce considerable flexibility, in terms of the possibility of conducting different decompression operations in parallel, while offering a high compression rate. Therefore, an embodiment of the invention offers a compression rate typically between 30 and 45%, without augmenting the number of cycles of execution of the code by more than 5%, when a memory cache is used for storing the decompressed instructions.

The invention claimed is:

1. A compression process for executable code by a microprocessor, comprising decomposing the executable code into words, and compressing each word of executable code, wherein each word of compressed executable code comprises a predefined part of fixed length and a part of variable length whereof the length is defined by the part of fixed length, the process further comprising a step of combining all the parts of fixed length and all the parts of variable length of the words respectively into a block of parts of fixed length and into a block of parts of variable length, the respective positions of at least certain parts of variable length in the block of parts of variable length being saved in an addressing table.

2. The compression process as claimed in claim 1, in which the executable code is divided into lines of a predefined number of instructions, each line of executable code being compressed into a line of parts of fixed length featuring in the block of parts of fixed length, and a line of parts of variable length featuring in the block of parts of variable length, each of the lines of parts of variable length being localized in the block of parts of variable length by means of the addressing table.

3. The compression process as claimed in claim 2, in which the addressing table comprises one input per group of a predefined number of lines of parts of variable length, each input specifying the position of a first line of parts of variable length in the set of parts of variable length of the compressed code, and the respective lengths of the lines of parts of variable length of the group, except for a last line of parts of variable length of the group, whereof the length is determined by means of the position of a first line of parts of variable length of a following group of lines of parts of variable length.

4. The compression process as claimed in claim 1, in which each of the words of the executable code to be compressed corresponds to an instruction.

5. The compression process as claimed in claim 1, in which the executable code is split into several parts, each containing a respective word of each instruction of the executable code to be compressed, the process being applied separately to each of the parts of executable code, to produce for each word of instruction of the executable code a part of fixed length which is inserted into the block of parts of fixed length and a part of variable length which is inserted into the block of parts of variable length.

6. The compression process as claimed in claim 1, in which the compression step comprises:
   constituting a histogram giving for each distinct word of the executable code a number of occurrences of this word in the executable code, and
   extracting at least part of the words of the histogram into a decompression table, in which the words are distributed into sub-tables collecting words having numbers of close occurrences in the histogram, each sub-table being associated with a predefined length,
   the part of fixed length of each word of the executable code referencing a sub-table of the decompression table, and the part of variable length giving a position in the sub-decompression table of the word of the executable code.

7. The compression process as claimed in claim 6, in which the words of the executable code associated in the histogram with a number of occurrences of less than a predetermined threshold are not inserted into the decompression table, each word of executable code not inserted into the decompression table being compressed by means of a part of fixed length specifying that the word of executable code does not feature in the decompression table, and a part of variable length containing at least a part of the word of executable code.

8. The compression process as claimed in claim 6, in which if two words of identical executable code appear consecutively in the executable code to be compressed, the second word of executable code is compressed without part of variable length, by means of a part of fixed length specifying that the word of executable code is the same as the preceding word.

9. The compression process as claimed in claim 6, in which the part of fixed length of each compressed word specifies according to its value:

either a number of sub-table of the decompression table, or that the word of the corresponding executable code is the second word of two identical consecutive words of the executable code, or that part of variable length of the compressed word contains at least a part of the word of corresponding executable code.

10. The compression process as claimed in claim 9, in which a predefined value of the part of fixed length of a compressed word specifies a stop point to be introduced to the executable code during a test phase of the program.

11. The compression process as claimed in claim 6, in which the division into sub-tables of the decompression table is selected to produce the smallest possible size of the set of parts of variable length of the compressed code.

12. The compression process as claimed in claim 6, in which the executable code is split into several parts, each containing a respective word of each instruction of the executable code to be compressed, the process being applied separately to each of the parts of executable code, to produce a decompression table for each part of the executable code.

13. A decompression process of executable code by a microprocessor, saved in a program memory zone in compressed form, the process comprising steps:

receiving from the microprocessor instruction requests of executable code comprising an instruction address to be executed, determining a reading address of an addressing table as a function of the instruction address to be executed, reading to the reading address in the addressing table addressing information of compressed words corresponding to the instruction to be executed, determining as a function of the addressing information read a reading address of the program memory, reading the program memory to the reading address, and decompressing the read words and transmitting them to the microprocessor, wherein each word of the executable code is compressed in the form of a part of predefined fixed length and a part of variable length whereof the length is defined by the part of fixed length, all the parts of fixed length and all the parts of variable length of the words of executable code being combined respectively into a block of parts of fixed length and into a block of parts of variable length, at least certain parts of variable length being localized a in the block of parts of variable length by means of an addressing table, the decompression process further comprising:

determining a reading address in the block of parts of fixed length as a function of the address of the instruction to be executed, reading the blocks of parts of fixed and variable length to the determined reading addresses, and decompressing the read parts of fixed and variable length to produce an executable instruction which is transmitted to the microprocessor.

14. The decompression process as claimed in claim 13, in which the compressed code is organized into lines of parts of fixed length and into lines of parts of variable length, each line of parts of fixed length and the associated line of parts of variable length corresponding to a respective line of a predefined number of instructions of executable code, each of the lines of parts of variable lengths being localized in the program memory zone by means of the addressing table, the process comprising:

reading a line of parts of fixed length and a line of parts of variable length, localized by means of the information read in the addressing table, and decompressing the lines of read parts of fixed and variable length to produce a line of executable instructions.

15. The decompression process as claimed in claim 14, in which the addressing table comprises one input per group of a predefined number of lines of parts of variable length each input specifying the position of a first line of parts of variable length in the set of parts of variable length of the compressed code, and the respective lengths of the lines of parts of variable length of the group, except for a last line of parts of variable length of the group, whereof the length is determined by means of the position of a first line of parts of variable length of a following group of lines of parts of variable length.

16. A decompression process of executable code by a microprocessor, saved in a program memory zone in compressed form, the process comprising:

receiving from the microprocessor instruction requests of executable code comprising an instruction address to be executed, determining a reading address of an addressing table as a function of the instruction address to be executed, reading to the reading address in the addressing table addressing information of compressed words corresponding to the instruction to be executed, determining as a function of the addressing information read a reading address of the program memory, reading the program memory to the reading address, and decompressing the read words and transmitting them to the microprocessor, wherein each word of the executable code is compressed in the form of a part of predefined fixed length and a part of variable length whereof the length is defined by the part of fixed length, all the parts of fixed length and all the parts of variable length of the words of executable code being combined respectively into a block of parts of fixed length and into a block of parts of variable length, at least certain parts of variable length being localized in the block of parts of variable length by means of an addressing table, the decompression process further comprising:

determining a reading address in the block of parts of fixed length as a function of the address of the instruction to be executed, reading the blocks of parts of fixed and variable length to the determined reading addresses, and decompressing the read parts of fixed and variable length to produce an executable instruction which is transmitted to the microprocessor, wherein the part of fixed length of each compressed instruction references a sub-table of a decompression table collecting at least part of the words of the executable code, the part of variable length giving the position in the sub-table of the word of executable code, the decompression of a part of fixed length and a part of corresponding variable length comprising:

determining the length of the part of variable length as a function of the value of the part of corresponding fixed length, reading the part of corresponding variable length considering the determined length of the part of variable length, and if the part of fixed length references a sub-table of the decompression table, reading the word of executable code in the sub-table of the decompression table referenced by the read part of fixed length, to a position defined by the part of variable length read.

17. The decompression process as claimed in claim 16, in which:

if the part of fixed length indicates that the word of corresponding executable code is a second word of two identical words appearing consecutively in the executable code, the part of fixed length is decompressed by the word of executable code previously decompressed;

if the part of fixed length specifies that the word of corresponding executable code does not feature in the decompression table, the process further comprises extraction steps of at least part of the word of executable code of the part of variable length corresponding to the part of fixed length; and if the part of fixed length specifies a stop point, a stop point is inserted into the decompressed executable code.

18. The decompression process as claimed in claim 13, in which each of the words of decompressed executable code corresponds to an instruction.

19. The decompression process as claimed in claim 16, in which the executable code is split into several parts, each containing a respective word of each instruction of the executable code to be compressed, each part of the executable code having been compressed separately and being associated with a respective decompression table collecting words of executable code of the part of the executable code.

20. A decompression unit of executable code by a microprocessor, saved in a program memory zone in compressed form, the decompression unit being connected to the microprocessor, the decompression unit comprising:

means for receiving from the microprocessor instruction requests of executable code comprising an instruction address to be executed, means for determining a reading address of an addressing table as a function of the instruction address to be executed, the addressing table localizing in the program memory certain saved compressed words, means for reading to the reading address in the addressing table addressing information of compressed words corresponding to the instruction to be executed, means for determining as a function of the read addressing information a reading address of the program memory, means for reading compressed words in the program memory to the reading address, means for decompressing the read compressed words to produce an executable instruction, and means for transmitting to the microprocessor the executable instruction, wherein each word of the executable code is compressed in the form of a part of predefined fixed length and a part of variable length, whereof the length is defined by the part of fixed length, all the parts of fixed length and all the parts of variable length of the words of executable code being combined into a program memory zone respectively in a block of parts of fixed length and in a block of parts of variable length, at least certain parts of variable length being localized in the block of parts of variable length by means of an addressing table, the decompression unit further comprising:

means for determining a reading address in the block of parts of fixed length as a function of the address of the instruction to be executed, means for reading the block of parts of fixed length to the determined reading address, and means for decompressing the parts of fixed and variable length read to produce an executable instruction.

21. The decompression unit as claimed in claim 20, further comprising means for storing starting addresses of the block of parts of fixed length and of the block of parts of variable length of the compressed code.

22. The decompression unit as claimed in claim 20, in which the compressed code is organized into lines of parts of fixed length and into lines of parts of variable length, each line of parts of fixed length and the associated line of parts of variable length corresponding to a respective line of a predefined number of instructions of executable code, each of the lines of parts of variable lengths being localized in the program memory zone by means of an addressing table saved in a zone of the program memory, the decompression unit further comprising means for storing a starting address of the addressing table.

23. The decompression unit as claimed in claim 22, in which the addressing table comprises one input per group of a predefined number of lines of parts of variable length each input specifying the position of a first line of parts of variable length in the set of the parts of variable length of the compressed code, and the respective lengths of the lines of parts of variable length of the group, except for a last line of parts of variable length of the group, whereof the length is determined by means of the position of a first line of parts of variable length from a following group of lines of parts of variable length, the decompression unit, further comprising:

means for receiving from the microprocessor instruction requests of executable code comprising an instruction address, means for reading the addressing table as a function of the instruction address of executable code provided by the microprocessor, means for determining by way of the addressing table the position in the program memory of the line of parts of fixed length containing the words of compressed code corresponding to the instruction address provided by the microprocessor, means for determining by way of the addressing table the position and length in the program memory of the line of parts of variable length containing the words of compressed code corresponding to the instruction address provided by the microprocessor, and means for decompressing and storing all the instructions of corresponding executable code to the line of read parts of fixed length and to the line of read parts of variable length.

24. The decompression unit as claimed in claim 20, further comprising:

a memory cache for saving a predefined number of decompressed instructions, means for reading the memory cache following receipt of an instruction request sent by the microprocessor, and for transmitting the corresponding instructions in response if the latter are in the memory cache.

25. The decompression unit as claimed in claim 20, in which at least certain parts of fixed length reference a sub-table of a decompression table collecting at least part of the words of the executable code, the part of variable length giving the position in the sub-table of the word of executable code, the decompression unit further comprising:

means for saving a decompression table, means for determining the position of the word of executable code to be read in the decompression table of the part of fixed length and of the part of variable length, if the part of fixed length references a sub-table of the decompression table, and means for reading the word of executable code to the position determined in the sub-table.

26. The decompression unit as claimed in claim 25, further comprising means for transmitting to the microprocessor a word of executable code previously decompressed if the part of fixed length indicates that the word of corresponding executable code is a second word of two identical words appearing consecutively in the executable code.

27. The decompression unit as claimed in claim 25, further comprising means for transmitting to the microprocessor the read part of variable length if the part of fixed length specifies that the word of corresponding executable code does not feature in the decompression table.

28. The decompression unit as claimed in claim 25, further comprising means for transmitting to the microprocessor a stop point of program execution, if the part of fixed length specifies it.

29. The decompression unit as claimed in claim 20, in which each of the words of decompressed executable code corresponds to an instruction.

30. The decompression unit as claimed in claim 25, in which the executable code is split into several parts, each containing a respective word of each instruction of the executable code to be compressed, each part of the executable code having been compressed separately and being associated with a respective decompression table collecting words of executable code of the part of the executable code.

31. A microprocessor comprising a decompression unit as claimed in claim 20.

32. A method, comprising:
storing a first group of first code words in sequential locations of a memory;
storing in an address table the respective starting location of the first group and the respective lengths of at least one of the first code words; and
storing a second group of second code words in sequential locations of the memory, each second code word having a same length, a combination of each first code word with a corresponding second code word representing a respective software-program instruction.

33. The method of claim 32 wherein storing the respective lengths comprises storing the respective lengths of all of the first code words except for the last first code word in the first group.

34. The method of claim 32, further comprising converting each of the software-programming instructions into a corresponding first code word based on a frequency of the instruction in a software program.

35. The method of claim 32, further comprising converting each of the software-programming instructions into a corresponding first code word having a length that is inversely proportional to a frequency of the instruction in a software program.

36. The method of claim 32 wherein the length of one of the first code words is different from the length of at least one other of the first code words.

37. The method of claim 32 wherein:
one of the second code words composes a base address of a software-programming-instruction table; and
a corresponding one of the first code words composes an index address of the software-programming-instruction table.

38. The method of claim 32 wherein:
one of the second code words indicates that a corresponding software-programming instruction is not included within a software-programming-instruction table; and
a corresponding one of the first code words includes at least a portion of the corresponding software-programming instruction.

39. The method of claim 32 wherein:
one of the second code words indicates that a corresponding software-programming instruction is not included within a software-programming-instruction table and includes a first portion of the corresponding software-programming instruction; and
a corresponding one of the first code words includes a second portion of the corresponding software-programming instruction.

40. The method of claim 32 wherein one of the second code words indicates that a corresponding software-programming instruction is not included within a software-programming-instruction table and includes at least a portion of the corresponding software-programming instruction.

41. The method of claim 32 wherein one of the second code words corresponds to no first code word and indicates that a corresponding software-programming instruction is the same as a software-programming instruction corresponding to a previous second code word in the second group.

42. The method of claim 32, further comprising:
storing a third group of first code words in sequential locations of the memory immediately following the locations in which the first group of code words are stored; and
wherein storing in an address table comprises storing in the address table the respective lengths of all but the last of the first code words in the first group, the starting location of the third group, and the respective lengths of all but the last of the first code words in the third group.

43. An electronic system, comprising:
a memory operable to include first and second code portions and an address table; and
a processor coupled to the memory and operable
to store a first group of first code words in sequential locations of the first code portion of the memory,
to store in the address table the respective starting location of the first group and the respective lengths of at least one of the first code words, and
to store a second group of second code words in sequential locations of the second code portion of the memory, each second code word having a same length, a combination of each first code word with a corresponding second code word representing a respective software-program instruction.

44. The electronic system of claim 43 wherein the processor and the memory are disposed on a same semiconductor die.

45. A method, comprising:
retrieving from an address table stored in a memory an address of a first group of sequential first code words and a length of at least a first one of the first code words;
retrieving from the memory the first one of the first code words in response to the address and the length;
retrieving from the memory one of a group of sequential second code words each having a same length, the one second code word corresponding to the first one of the first code words; and
obtaining a first software-programming instruction from the retrieved first and second code words.

46. The method of claim 45 wherein retrieving the length of at least a first one of the first code words comprises retrieving the lengths of all of the first code words but the last of the first code words.

47. The method of claim 45 wherein obtaining the software-programming instruction comprises generating the instruction equal to the retrieved first code word.

48. The method of claim 45 wherein obtaining the software-programming instruction comprises generating the instruction by combining the retrieved first code word with a portion of the retrieved second code word.

49. The method of claim 45 wherein obtaining the software-programming instruction comprises retrieving the instruction from a location of the memory addressed by the retrieved first and second code words.

50. The method of claim 45 wherein obtaining the software-programming instruction comprises retrieving the instruction from a location of the memory having an address equal to a sum of the first and second code words.

51. The method of claim 45 wherein obtaining the software-programming instruction comprises retrieving the instruction from a section of memory addressed by the retrieved second code word and from a location within the section addressed by the retrieved first code word.

52. The method of claim 45, further comprising:
retrieving from the memory another second code word immediately following the previously retrieved one second code word; and
obtaining a second software-programming instruction equal to the first software-programming instruction in response to the other second code word.

53. The method of claim 45, further comprising:
retrieving from the memory another second code word immediately following the previously retrieved one second code word and having no corresponding first code word; and
obtaining a second software-programming instruction equal to the first software-programming instruction in response to the other second code word.

54. The method of claim 45, further comprising:
wherein retrieving from an address table comprises retrieving from the address table a length of all but the last one of the first code words in the first group;
retrieving from the address table an address for a second group of the first code words; and
determining a length of the last one of the first code words in the first group from the address of the first group of first code words, the lengths of all but the last one of the first code words in the first group, and the address of the second group of first code words.

55. An electronic system, comprising:
a memory operable to include first and second code portions and an address table; and
a processor coupled to the memory and operable
to retrieve from the address table an address of a first group of sequential first code words in the first code portion and a length of at least a first one of the first code words,
to retrieve from the first code portion the first one of the first code words in response to the address and the length,
to retrieve from the second code portion one of a group of sequential second code words each having a same length, the one second code word corresponding to the first one of the first code words, and
to obtain a first software-programming instruction from the retrieved first and second code words.

56. The electronic system of claim 55 wherein the processor and the memory are disposed on a same semiconductor die.

* * * * *

UNITED STATES PATENT AND TRADEMARK OFFICE
CERTIFICATE OF CORRECTION

PATENT NO. : 7,616,137 B2  Page 1 of 1
APPLICATION NO. : 11/480769
DATED : November 10, 2009
INVENTOR(S) : Didier Fuin It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 631 days.

Signed and Sealed this

Nineteenth Day of October, 2010

David J. Kappos
*Director of the United States Patent and Trademark Office*